(12) United States Patent
Watanabe

(10) Patent No.: US 7,332,940 B2
(45) Date of Patent: Feb. 19, 2008

(54) VOLTAGE HOLD CIRCUIT AND CLOCK SYNCHRONIZATION CIRCUIT

(75) Inventor: Kazuhiko Watanabe, Gifu (JP)

(73) Assignee: Sanyo Electric Co., Ltd., Moriguchi (JP)

( * ) Notice: Subject to any disclaimer, the term of this patent is extended or adjusted under 35 U.S.C. 154(b) by 0 days.

(21) Appl. No.: 11/392,663

(22) Filed: Mar. 30, 2006

(65) Prior Publication Data
US 2006/0220694 A1    Oct. 5, 2006

(30) Foreign Application Priority Data
Mar. 30, 2005    (JP) ................ P2005-099490

(51) Int. Cl.
*G11C 27/02*    (2006.01)
(52) U.S. Cl. ...................... 327/94; 327/156
(58) Field of Classification Search .............. None
See application file for complete search history.

(56) References Cited

U.S. PATENT DOCUMENTS

| | | | | | |
|---|---|---|---|---|---|
| 4,136,396 | A | * | 1/1979 | Hansford | 702/84 |
| 5,355,098 | A | * | 10/1994 | Iwasaki | 331/14 |
| 5,486,784 | A | * | 1/1996 | Eriksson | 327/165 |
| 5,892,408 | A | * | 4/1999 | Binder | 331/44 |
| 5,914,682 | A | * | 6/1999 | Noguchi | 341/145 |
| 6,060,914 | A | * | 5/2000 | Nunokawa | 327/91 |
| 6,157,603 | A | * | 12/2000 | Okubo et al. | 369/53.1 |
| 6,172,637 | B1 | * | 1/2001 | Kugler | 341/158 |
| 6,385,442 | B1 | * | 5/2002 | Vu et al. | 455/318 |
| 6,404,292 | B1 | * | 6/2002 | Lautzenhiser | 331/17 |
| 6,496,126 | B2 | * | 12/2002 | Zhan et al. | 341/139 |
| 6,987,409 | B2 | * | 1/2006 | Kim et al. | 327/158 |
| 2004/0039375 | A1 | * | 2/2004 | Miyazawa | 604/542 |

FOREIGN PATENT DOCUMENTS

JP    05-030092    2/1993

* cited by examiner

*Primary Examiner*—Cassandra Cox
(74) *Attorney, Agent, or Firm*—NDQ&M Watchstone LLP; S. Peter Konzel

(57) ABSTRACT

A voltage hold circuit which holds an input signal voltage includes a voltage comparator unit configured to output a result of comparison between a voltage of an externally inputted control signal and a voltage of an outputted analog hold signal, a digital value hold unit configured to increase or decrease a hold value which is a digital value it holds, based on the comparison result, and to output a digital hold signal which is a digital value generated based on the hold value, and a D/A converter unit configured to convert the digital hold signal to an analog value for output as the analog hold signal.

8 Claims, 3 Drawing Sheets

VOLTAGE HOLD CIRCUIT AND CLOCK SYNCHRONIZATION CIRCUIT

CROSS REFERENCE TO RELATED APPLICATION

This application is based upon and claims the benefit of priority from the prior Japanese Patent Application No. P2005-099490, filed on Mar. 30, 2005; the entire contents of which are incorporated herein by reference.

BACKGROUND OF THE INVENTION

1. Field of the Invention

The present invention relates to voltage hold circuits which holds an input signal voltage, and clock synchronization circuits including the voltage hold circuits.

2. Description of the Related Art

A related art having been provided in clock synchronization circuits for keeping the phase difference between an externally inputted reference clock signal and an output signal constant holds the voltage value of a control signal extracted from an inputted reference clock signal to be inputted to an oscillator configured to control the frequency of an output signal. When a reliable reference clock signal cannot be obtained due to some trouble, a signal of the held voltage is inputted to the oscillator. In this related art, an A/D converter is used.

As a voltage hold circuit, an analog sample-hold circuit is also known. In the sample-hold circuit, a voltage is held by storing a charge in a capacitor.

The A/D converter is, however, relatively costly. In particular, the related art using the A/D converter and a D/A converter needs to use an expensive A/D converter and D/A converter of good characteristics, especially linearity, to increase accuracy.

Also, in the sample-hold circuit, the charge stored in the capacitor is released with time, and thus the sample-hold circuit cannot hold the voltage for a long time.

BRIEF SUMMARY OF THE INVENTION

The present invention has been made in view of the above problems, and has an object of providing a voltage hold circuit capable of holding an input signal voltage for a long time with reduced costs, and a clock synchronization circuit including the voltage hold circuit.

A first aspect of the present invention is summarized as a voltage hold including: a voltage comparator unit configured to output a result of comparison between a voltage of an externally inputted control signal and a voltage of an analog hold signal outputted from the voltage hold circuit; a digital value hold unit configured to increase or decrease a hold value which is a digital value held by the digital value hold unit, based on the comparison result, and to output a digital hold signal which is a digital value generated based on the hold value; and a D/A converter unit configured to convert the digital hold signal to an analog value for output as the analog hold signal.

In the first aspect, the digital value hold unit can be configured to increase the hold value held by the digital value hold unit when the comparison result shows that the voltage of the control signal is higher than the voltage of the analog hold signal, and to decrease the hold value held by the digital value hold unit when the comparison result shows that the voltage of the control signal is lower than the voltage of the analog hold signal.

In the first aspect, the digital value hold unit can be configured to output an average value of hold values in a certain past period as the digital hold signal.

In the first aspect, the digital value hold unit can be configured to adjust an amount by which the hold value is increased or decreased, based on results of comparison by the voltage comparator unit in a certain past period.

In the first aspect, the voltage comparator unit can be a comparator; and the digital value hold unit can be a counter.

A second aspect of the present invention is summarized as a clock synchronization circuit, including: an oscillator configured to control a frequency of an output clock signal to be outputted, based on a voltage of an input signal; a phase comparator configured to output a phase difference between an externally inputted reference clock signal and a comparison clock signal generated based on the output clock signal and being of a frequency equal to a frequency of the reference clock signal; a low-pass filter configured to remove an alternating-current component from an output of the phase comparator for conversion to a control signal which is a direct-current signal; a voltage hold circuit configured to hold a voltage of the control signal; and a switch configured to obtain the control signal and an analog hold signal outputted from the voltage hold circuit, and to input the analog hold signal to the oscillator when obtaining an alarm signal showing that a reliable reference clock signal is not inputted, and to input the control signal to the oscillator when not obtaining the alarm signal; and the voltage hold circuit includes: a voltage comparator unit configured to output a result of comparison between the voltage of the control signal and a voltage of the analog hold signal; a digital value hold unit configured to increase or decrease a hold value which is a digital value held by the digital value hold unit, based on the comparison result, and to output a digital hold signal which is a digital value generated based on the hold value; and a D/A converter unit configured to convert the digital hold signal to an analog value for output as the analog hold signal.

DETAILED DESCRIPTION OF THE INVENTION

First Embodiment (Voltage Hold Circuit)

Figure 1:
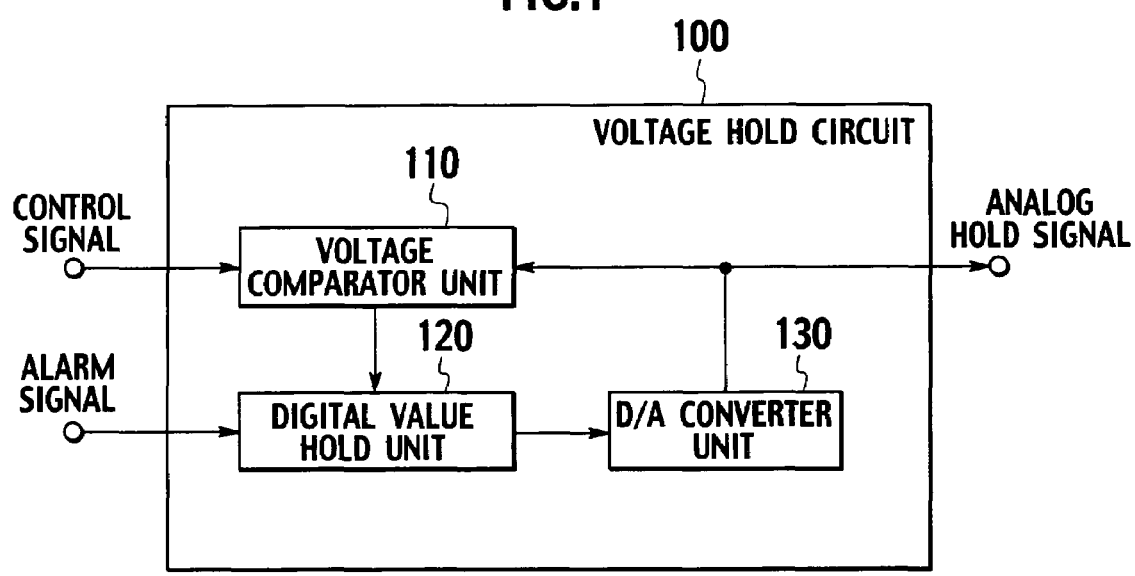
FIG. 1 is a configuration diagram of a voltage hold circuit according to a first embodiment of the present invention.

FIG. 1 shows a configuration diagram of a voltage hold circuit 100 according to a first embodiment of the present invention.

The voltage hold circuit 100 is configured to obtain an externally inputted control signal, and to output an analog hold signal adjusted to a voltage equal to the voltage of the control signal.

As shown in FIG. 1, the voltage hold circuit 100 includes a voltage comparator unit 110, a digital value hold unit 120, and a D/A converter unit 130.

The voltage comparator unit 110 is configured to output a result of comparison between the voltage of an externally inputted control signal and the voltage of an analog hold signal outputted from the voltage hold circuit 100.

Specifically, the voltage comparator unit 110 is configured to obtain an externally inputted control signal and an analog hold signal outputted by the D/A converter unit 130 to be described below.

The voltage comparator unit 110 is configured to compare the voltages of the obtained control signal and analog hold signal.

The voltage comparator unit 110 is configured to output the comparison result showing whether the control signal voltage is higher than the analog hold signal voltage or the control signal voltage is lower than the analog hold signal voltage, as the comparison result.

The comparison result in this embodiment is thus one of two values. For example, a signal of a high voltage value or a signal of a low voltage value is outputted.

The digital value hold unit 120 is configured to increase or decrease a hold value which is a digital value it holds, based on the comparison result obtained from the voltage comparator unit 110, and to output a digital hold signal which is a digital value generated based on the hold value.

The digital value hold unit 120 in this embodiment is configured to increase the hold value it holds when the comparison result inputted from the voltage comparator unit 110 shows that the control signal voltage is higher than the analog hold signal voltage, and to decrease the hold value it holds when the control signal voltage is lower than the analog hold signal voltage.

The amount by which the digital value hold unit 120 increases or decreases the hold value based on the comparison result may be the same (e.g., one).

Alternatively, the amount by which the hold value is increased or decreased based on the comparison result may be adjusted, based on results of comparison by the voltage comparator unit 110 in a certain past period.

For example, when every comparison result in the certain past period shows that the control signal voltage is higher than the analog hold signal voltage or shows that the control signal voltage is lower than the analog hold signal voltage, the amount by which the hold value is increased or decreased may be increased (e.g., two).

A digital value generated by the digital value hold unit 120 based on the hold value and outputted as a digital hold signal may be the hold value itself, or may be the average value of hold values in a certain past period.

The digital value hold unit 120 is implemented by a counter including a plurality of flip-flop circuits, for example.

The digital value hold unit 120 in this embodiment is also configured to obtain an alarm signal showing that a reliable control signal is not inputted.

When obtaining the alarm signal, the digital value hold unit 120 is configured to keep holding the last hold value without increasing or decreasing the hold value.

The D/A converter unit 130 is configured to convert a digital hold signal outputted from the digital value hold unit 120 to an analog value, and to output it as an analog hold signal. The D/A converter unit 130 is implemented by a D/A converter, for example.

(Voltage Hold Method)

Figure 2:
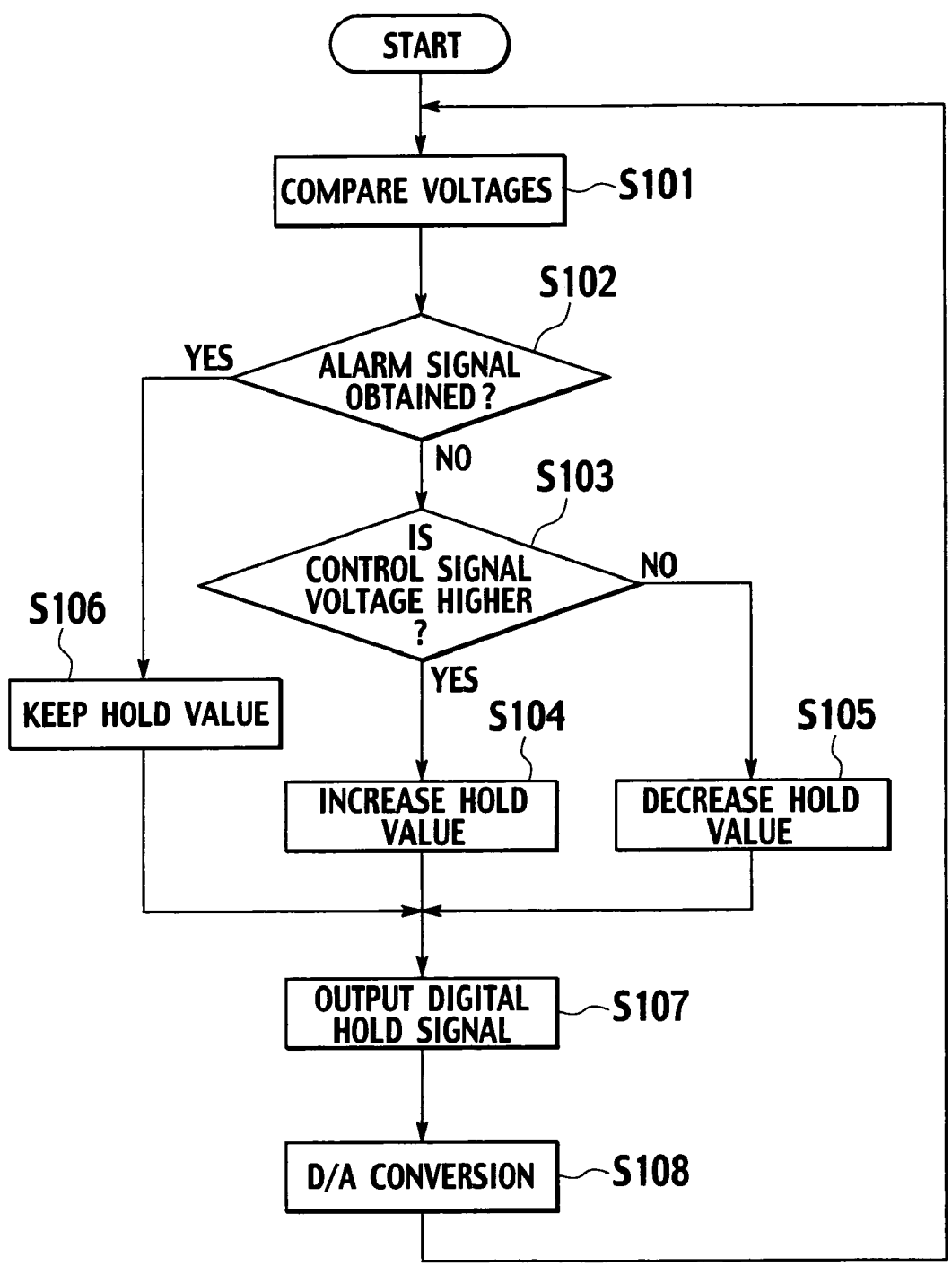
FIG. 2 is a flow chart showing a process of outputting an analog hold signal adjusted to a voltage equal to the voltage of an input control signal in the voltage hold circuit according to the first embodiment.

Next, a process of outputting an analog hold signal adjusted to a voltage equal to the voltage of an input control signal in the voltage hold circuit 100 will be described with reference to FIG. 2.

In step S101, the voltage comparator unit 110 compares the voltage of a control signal and the voltage of an analog hold signal.

In step S102, the digital value hold unit 120 determines whether an alarm signal has been obtained or not.

When the digital value hold unit 120 determines in step S102 that an alarm signal has not been obtained, in step S103, the digital value hold unit 120 determines whether the comparison result shows that the control signal voltage is higher than the analog hold signal voltage or not.

When the digital value hold unit 120 determines in step S103 that the comparison result shows that the control signal voltage is higher than the analog hold signal voltage, in step S104, the digital value hold unit 120 increases the hold value, which is a digital value.

On the other hand, when the digital value hold unit 120 determines in step S103 that the comparison result shows that the control signal voltage is lower than the analog hold signal voltage, in step S105, the digital value hold unit 120 decreases the hold value, which is a digital value.

When the digital value hold unit 120 determines in step S102 that an alarm signal has been obtained, in step S106, the digital value hold unit 120 keeps holding the last hold value without increasing or decreasing the hold value.

In step S107, the digital value hold unit 120 outputs a digital hold signal, which is a digital value generated based on the hold value it holds.

In step S108, the D/A converter unit 130 converts the digital hold signal to an analog value, and outputs an analog hold signal.

(Effects)

In the voltage hold circuit 100 according to this embodiment, the voltage comparator unit 110 compares the voltages of an externally inputted control signal and an analog hold signal outputted from the D/A converter unit 130. The digital value hold unit 120 increases or decreases a hold value it holds, based on a result of the comparison by the voltage comparator unit 110.

These steps are repeated, whereby the hold value held by the digital value hold unit 120 becomes a value which can be changed to a voltage value equal to that of the control signal.

In this manner, the voltage of the analog hold signal outputted from the D/A converter unit 130 is adjusted to a voltage equal to that of the control signal.

Further, since the voltage hold circuit 100 does not include an A/D converter unit for converting an analog value to a digital value, costs can be reduced.

Also, unlike a conventional sample-hold circuit, release of a charge stored in a capacitor does not happen, so that a voltage can be held for a long time.

Consequently, it becomes possible to hold an input signal voltage for a long time with reduced costs.

The voltage comparator unit 110 outputs a comparison result showing that a control signal voltage is higher or lower than the analog hold signal voltage, and the digital value hold unit 120 increases the hold value when the output from the voltage comparator unit 110 shows that the control signal voltage is higher than the analog hold signal voltage, and decreases the hold value when the control signal voltage is lower than the analog hold signal voltage.

In this manner, the hold value held by the digital value hold unit 120 comes close to a value which can be changed to a voltage value equal to that of the control signal.

In the case where the average value of hold values in a certain past period is outputted as a digital hold signal, the value of the outputted digital hold signal does not change rapidly even when the control signal voltage varies in a short time. Consequently, an analog hold signal can be kept at a more stable voltage.

In the case where the digital value hold unit 120 adjusts the amount by which the hold value is increased or decreased, based on results of comparison by the voltage comparator unit 110 in a certain past period, the amount by which the hold value is increased or decreased can be increased when every comparison result in the certain past period shows that the control signal voltage is higher than the analog hold signal voltage, or shows that the control signal voltage is lower than the analog hold signal voltage, for example.

When every comparison result in the certain past period shows that the control signal voltage is higher than the analog hold signal voltage, or shows that the control signal voltage is lower than the analog hold signal voltage, it is probable that the voltage of the control signal is greatly different from the voltage of the analog hold signal.

By increasing the amount of increase or decrease, the voltage of the analog hold signal can be adjusted quickly to be equal to the voltage of the control signal.

In a related art using an A/D converter and a D/A converter, it is likely that a bit error in the A/D converter and a bit error in the D/A converter are added.

Also, in order to increase the accuracy of a voltage hold circuit including an A/D converter and a D/A converter, it is necessary to match the characteristics, mainly the linearity, of the A/D converter and the D/A converter.

This embodiment does not use an A/D converter, thus making it possible to hold an input signal voltage more accurately and more easily.

Second Embodiment (Clock Synchronization Circuit)

Figure 3:
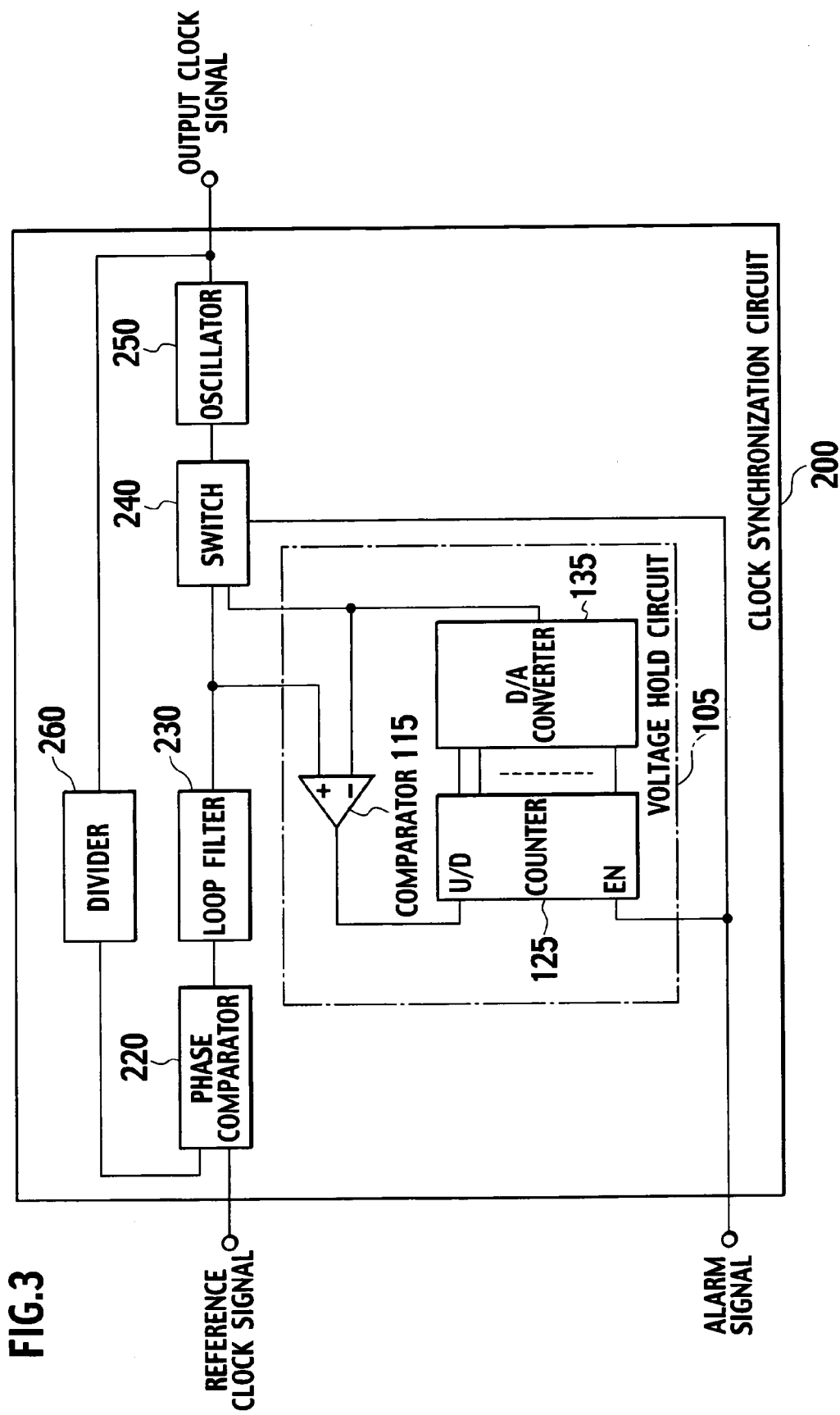
FIG. 3 is a configuration diagram of a clock synchronization circuit according to a second embodiment of the present invention.

FIG. 3 shows a configuration diagram of a clock synchronization circuit 200 according to a second embodiment of the present invention.

The clock synchronization circuit 200 is configured to keep the phase difference between an externally inputted reference clock signal and an outputted output clock signal constant. The reference clock signal is extracted from ISDN, for example.

As shown in FIG. 3, the clock synchronization circuit 200 includes a voltage hold circuit 105, a phase comparator 220, a loop filter 230, a switch 240, an oscillator 250, and a divider 260.

Like the voltage hold circuit 100 in the first embodiment, the voltage hold circuit 105 is configured to output an analog hold signal adjusted to a voltage equal to the voltage of an externally inputted control signal.

The voltage hold circuit 105 in this embodiment includes a comparator 115, a counter 125, and a D/A converter 135.

Like the voltage comparator 110 in the first embodiment, the comparator 115 is configured to output a result of comparison between the voltage of a control signal outputted from the loop filter 230 to be described below and the voltage of an analog hold signal outputted from the voltage hold circuit 105.

The comparator 115 is configured to compare one of two inputs of an operational amplifier as the reference to the other input voltage, and to output a Hi-level voltage signal or a Low-level voltage signal as the comparison result.

For example, the comparator 115 is configured to output a Hi-level voltage signal as the comparison result when the control signal voltage is higher than the analog hold signal voltage, and to output a Low-level voltage signal when the control signal voltage is lower than the analog hold signal voltage.

Like the digital value hold unit 120 in the first embodiment, the counter 125 is configured to increase or decrease a hold value which is a digital value it holds, based on the comparison result obtained from the comparator 115, and to output a digital hold signal which is a digital value generated based on the hold value.

The counter 125 in this embodiment is configured to obtain an output from the comparator 115 at a terminal denoted by U/D in FIG. 3.

The counter 125 is configured to count up when obtaining a Hi-level voltage signal from the comparator 115, and to count down when obtaining a Low-level voltage signal from the comparator 115. The counter 125 is provided using a plurality of flip-flop circuits, for example.

The amount by which the hold value is increased or decreased by the counter 125 in this embodiment based on the comparison result is always one. A digital value generated by the counter 125 based on the hold value and outputted as a digital hold signal is the hold value itself.

Like the digital value hold unit 120 in the first embodiment, the counter 125 in this embodiment is configured to obtain an alarm signal showing that a reliable control signal is not inputted, at an enable terminal denoted by EN in FIG. 3.

An alarm signal in this embodiment shows that a reliable reference clock signal is not inputted to the clock synchronization circuit 200.

A control signal is extracted from a reference clock signal. Therefore, an alarm signal also shows that a reliable control signal is not inputted.

The counter 125 is configured to keep holding the last hold value without counting up or down when obtaining an alarm signal.

The D/A converter 135 is configured to convert a digital hold signal outputted from the counter 125 to an analog value, and to output it as an analog hold signal.

The phase comparator 220 is configured to output a phase difference between a reference clock signal and a comparison clock signal generated based on an output clock signal outputted from the oscillator 250 to be described below and being of a frequency equal to that of the reference clock signal.

Specifically, the phase comparator 220 is configured to output a pulse proportional to the phase difference between an externally inputted reference clock signal and a comparison clock signal outputted from the divider 260 to be described below.

The loop filter 230 is a low-pass filter configured to remove an alternating-current component from an output of the phase comparator 220 for conversion to a direct-current control signal.

The switch 240 is configured to obtain a control signal outputted from the loop filter 230 and an analog hold signal outputted from the voltage hold circuit 105, to input the analog hold signal to the oscillator 250 to be described below when obtaining an alarm signal showing that a reliable reference clock signal is not inputted, and to input the control signal to the oscillator 250 when not obtaining an alarm signal.

The oscillator 250 is configured to control the frequency of an output clock signal to be outputted, based on an input signal voltage.

The divider 260 is configured to generate a comparison clock signal of a frequency equal to that of a reference clock signal, using an output clock signal, and to outputs it.

Specifically, the divider 260 is configured to divide an output clock signal to the frequency of a reference clock signal, and to output it as a comparison clock signal.

(Effects)

According to this embodiment, the voltage hold circuit 105 can be implemented using commonly used components. Compared to a related art which holds a voltage using an A/D converter, flip-flop circuits, and a D/A converter, the voltage hold circuit 105 including the comparator 115, the counter 125, and the D/A converter 135 can hold a voltage at a lower cost.

Also, according to this embodiment, the comparator 115 and the counter 125 allows a hold value which can be changed to a voltage value equal to that of a control signal to be held. The D/A converter 135 converts a digital hold signal generated based on the hold value to an analog value, and outputs it as an analog hold signal.

The switch 240 obtains a control signal extracted from a reference clock signal to be inputted to the oscillator 250 for controlling the frequency of an output signal, and an analog hold signal, and outputs one of the control signal and the analog hold signal, based on whether an alarm signal is obtained or not.

When a reliable reference clock signal is not obtained, an analog hold signal is inputted to the oscillator 250, and when a reliable reference clock signal is obtained, a control signal is inputted to the oscillator 250.

Consequently, with costs reduced, when a reference clock signal cannot be obtained, an output clock signal synchronized to the reference clock signal obtained last can be outputted for a long time.

(Modification)

Although the present invention has been described with the above embodiments, the statement and drawings constituting part of this disclosure should not be regarded as limiting the invention. From this disclosure, various alternative embodiments, examples and operation techniques will be obvious to those skilled in the art.

For example, although the clock synchronization circuit 200 shown in the second embodiment includes the divider 260, the clock synchronization circuit 200 does not need to include the divider 260 if an output clock signal and a reference clock signal are of an equal frequency.

In the second embodiment, the clock synchronization circuit 200 includes the counter 125 as a component serving the function of the digital value hold unit 120 in the first embodiment.

Alternatively, the function of the digital value hold unit 120 can be implemented by a microcomputer or the like.

With this, it becomes easy for the digital value hold unit 120 to adjust the amount by which a hold value is increased or decreased based on a comparison result, and output the average value of hold values in a certain past period as a digital hold signal, as illustrated in the first embodiment.

The present invention can provide a voltage hold circuit capable of holding an input signal voltage for a long time with reduced costs, and a clock synchronization circuit including the voltage hold circuit.

Additional advantages and modifications will readily occur to those skilled in the art. Therefore, the invention in its broader aspects is not limited to the specific details and the representative embodiments shown and described herein. Accordingly, various modifications may be made without departing from the scope of the general inventive concept as defined by the appended claims and their equivalents.

What is claimed is:

1. A voltage hold circuit which holds a voltage of an external input signal, comprising:
    a voltage comparator unit configured to output a result of comparison between a voltage of an externally inputted control signal and a voltage of an analog hold signal outputted from the voltage hold circuit;
    a digital value hold unit configured to increase or decrease a hold value which is a digital value held by the digital value hold unit, based on the comparison result, to output a digital hold signal which is a digital value generated based on the hold value, and configured to maintain said hold value notwithstanding said comparison result in response to a signal indicating unreliability of said control signal; and
    a D/A converter unit configured to convert the digital hold signal to an analog value for output as the analog hold signal.

2. The voltage hold circuit as set forth in claim 1, wherein the digital value hold unit is configured to increase the hold value held by the digital value hold unit when the comparison result shows that the voltage of the control signal is higher than the voltage of the analog hold signal, and to decrease the hold value held by the digital value hold unit when the comparison result shows that the voltage of the control signal is lower than the voltage of the analog hold signal.

3. The voltage hold circuit as set forth in claim 1, wherein the digital value hold unit is configured to output an average value of hold values in a certain past period as the digital hold signal.

4. The voltage hold circuit as set forth in claim 1, wherein the digital value hold unit is configured to adjust an amount by which the hold value is increased or decreased, based on results of comparison by the voltage comparator unit in a certain past period.

5. The voltage hold circuit as set forth in claim 1, wherein:
    the voltage comparator unit is a comparator; and the digital value hold unit is a counter.

6. A clock synchronization circuit, comprising:
    an oscillator configured to control a frequency of an output clock signal to be outputted, based on a voltage of an input control signal;
    a phase comparator configured to output a phase difference between an externally inputted reference clock signal and a comparison clock signal based on the output clock signal, which phase difference output is used to develop said input control signal;
    a voltage hold circuit configured to hold a voltage corresponding to the control signal; and
    a switch configured to receive the control signal and an analog hold signal outputted from the voltage hold circuit, and to input the analog hold signal to the oscillator when obtaining an alarm signal showing that a reliable reference clock signal is not inputted, and to input the control signal to the oscillator when not obtaining the alarm signal;

the voltage hold circuit comprising:
- a voltage comparator unit configured to output a result of comparison between the voltage of the control signal and a voltage of the analog hold signal;
- a digital value hold unit configured to increase or decrease a hold value which is a digital value held by the digital value hold unit, based on the comparison result, and to output a digital hold signal which is a digital value generated based on the hold value; and
- a D/A converter unit configured to convert the digital hold signal to an analog value for output as the analog hold signal.

7. A voltage hold circuit which holds a voltage of an external input signal, comprising:
- a voltage comparator unit configured to output a result of comparison between a voltage of an externally inputted control signal and a voltage of an analog hold signal outputted from the voltage hold circuit;
- a digital value hold unit configured to increase or decrease a hold value which is a digital value held by the digital value hold unit, based on the comparison result, and to output a digital hold signal which is a digital value generated based on the hold value; and
- a D/A converter unit configured to convert the digital hold signal to an analog value for output as the analog hold signal, and wherein
- the digital value hold unit is configured to output an average value of hold values in a certain past period as the digital hold signal.

8. The voltage hold circuit as set forth in claim 7, wherein the digital value hold unit is configured to adjust an amount by which the hold value is increased or decreased, based on results of comparison by the voltage comparator unit in a certain past period.

* * * * *